US011611192B2

(12) United States Patent
Amalfi et al.

(10) Patent No.: US 11,611,192 B2
(45) Date of Patent: Mar. 21, 2023

(54) EMBEDDED MICROFLUIDIC DISTRIBUTION APPARATUS FOR PASSIVELY COOLING OPTOELECTRONIC DEVICES

(71) Applicant: Accelsius, LLC, Orlando, FL (US)

(72) Inventors: Raffaele Luca Amalfi, New Providence, NJ (US); Stefano Grillanda, Springfield, NJ (US)

(73) Assignee: Accelsius, LLC, Orlando, FL (US)

( * ) Notice: Subject to any disclaimer, the term of this patent is extended or adjusted under 35 U.S.C. 154(b) by 383 days.

(21) Appl. No.: 16/844,904

(22) Filed: Apr. 9, 2020

(65) Prior Publication Data

US 2021/0104863 A1  Apr. 8, 2021

Related U.S. Application Data

(60) Provisional application No. 62/910,735, filed on Oct. 4, 2019.

(51) Int. Cl.
*H01S 5/024* (2006.01)
*H01S 3/106* (2006.01)
(Continued)

(52) U.S. Cl.
CPC .......... *H01S 5/0243* (2013.01); *H01S 3/1062* (2013.01); *F28D 15/04* (2013.01); *F28F 3/12* (2013.01)

(58) Field of Classification Search
CPC ...... H01S 3/1062; H01S 5/0243; F28D 15/04; F28D 15/0266; F28D 15/043; F28F 3/12
(Continued)

(56) References Cited

U.S. PATENT DOCUMENTS 7,184,265 B2* 2/2007 Kim ................. H01L 23/467
361/679.55
7,249,627 B2* 7/2007 Choi ................. F28D 15/0233
165/104.21
(Continued)

FOREIGN PATENT DOCUMENTS

| CN | 101924321 A | 12/2010 |
| CN | 102163788 A | 8/2011 |
| CN | 103595349 A | 2/2014 |

OTHER PUBLICATIONS

Palko et al., "High Heat Flux Two-Phase Cooling of Electronics with Integrated Diamond/Porous Copper Heat Sinks and Microfluidic Coolant Supply," 15th IEEE Intersociety Conference on Thermal and Thermomechanical Phenomena in Electronic Systems, May 31-Jun. 3, 2016, 7 pgs.

*Primary Examiner* — Jon T. Schermerhorn, Jr.
(74) *Attorney, Agent, or Firm* — Geoffrey Lottenberg; Berger Singerman LLP

(57) ABSTRACT

A device and method are provided for more efficient thermal management of optoelectronic devices. A microfluidic distribution apparatus embedded with the optoelectronic device uses a working fluid in phase change to passively remove heat from an optoelectronic device. The working fluid undergoes phase change through various conversions between a liquid state and a two-phase liquid-vapor state to facilitate evaporation and condensation processes as the working fluid is distributed through micro-structures in the embedded microfluidic distribution apparatus. Passive two-phase cooling provides high thermal performance due to the use of the latent heat of a fluid in phase change, as well as the presence of favorable two-phase flow regimes at microscale dimensions.

18 Claims, 12 Drawing Sheets

(51) Int. Cl.
  *F28D 15/04* (2006.01)
  *F28F 3/12* (2006.01)
(58) Field of Classification Search
  USPC .......................................................... 372/35
  See application file for complete search history.

(56) References Cited

U.S. PATENT DOCUMENTS

| | | |
|---|---|---|
| 2003/0231668 A1 | 12/2003 | Hoar et al. |
| 2014/0029945 A1 | 1/2014 | Martinelli et al. |
| 2014/0246176 A1* | 9/2014 | Yang .................. F28D 15/0266 |
| | | 165/104.26 |
| 2016/0127044 A1 | 5/2016 | Ho et al. |
| 2017/0293329 A1* | 10/2017 | Chiriac ..................... G06F 1/20 |
| 2019/0181071 A1 | 6/2019 | Harris et al. |

* cited by examiner

EMBEDDED MICROFLUIDIC DISTRIBUTION APPARATUS FOR PASSIVELY COOLING OPTOELECTRONIC DEVICES

CROSS-REFERENCE TO RELATED APPLICATIONS

This application claims the benefit of priority from prior-filed U.S. Provisional Patent Application Ser. No. 62/910,735, filed Oct. 4, 2019, the disclosure of which is incorporated herein in its entirety.

TECHNICAL FIELD

The present invention relates generally to thermal management solutions for optoelectronic devices, and more specifically to an apparatus and method for passively removing heat from optoelectronic devices using a microfluidic cooling structure embedded with the optoelectronic device.

BACKGROUND

Thermal management of optoelectronic devices is becoming more and more essential for ensuring proper operation and optimized performance. Thermo-electric coolers (TECs) are widely used as the cooling solution for optoelectronic devices, however, TECs have disadvantages.

Thermal management of optoelectronic devices has also become very challenging with the use of more integrated packaging in which an increasing number of components are situated in a more compact device (located in a package), which generates higher heat density dissipations that need to be managed. As such, TECs may not be considered to be practical solutions given their cost, power consumption requirements and energy inefficiencies. To the knowledge of the inventors, other alternatives, such as solid-state conduction and multi-phase systems using wick structures (e.g., heat pipes), have not been widely adopted for optoelectronic devices as they typically have limited capacity in handling high heat density dissipations.

SUMMARY

In accordance with various embodiments, an embedded microfluidic distribution apparatus uses a working fluid in phase change to passively remove heat from an optoelectronic device. The working fluid undergoes phase change through various conversions between a liquid state and a two-phase liquid-vapor state to facilitate evaporation and condensation processes as the working fluid is distributed through micro-structures in the embedded microfluidic distribution apparatus. In contrast to conventional cooling arrangements, the embedded microfluidic distribution apparatus provides an energy-efficient solution for passively removing heat without consuming power and it is scalable to manage high heat density dissipations from highly integrated optoelectronic devices.

According to an embodiment, an apparatus for cooling an optoelectronic device includes a microfluidic distribution apparatus positioned in an embedded arrangement with the optoelectronic device. The microfluidic distribution apparatus, which includes a plurality of micro-structures (e.g., micro-channels, micro-fins, etc.) that form a closed loop fluid distribution circuit, is configured to distribute a working fluid capable of phase change to passively remove heat from the optoelectronic device. More specifically, the working fluid is distributed in a liquid state through the plurality of micro-structures, wherein the working fluid converts to a two-phase liquid-vapor state to remove heat generated by the optoelectronic device via an evaporation process. The working fluid in the two-phase liquid-vapor state is further distributed through the plurality of micro-structures to passively dissipate heat to air in natural convection via a condensation process. The working fluid is converted from the two-phase liquid-vapor state back to the liquid state for recirculation via the plurality of micro-structures.

According to an embodiment, the microfluidic distribution apparatus comprises an evaporator section, condenser section and an adiabatic section. The plurality of micro-structures forming the closed loop fluid distribution circuit comprise micro-structures (e.g., micro-channels, micro-fins, etc.) in the evaporator section and the condenser section, and in the feeder and return micro-structures in the adiabatic section. In this embodiment, working fluid in the liquid state is distributed through the micro-structures in the evaporator section to facilitate the evaporation process and further distributed in the two-phase liquid-vapor state through the feeder micro-structures in the adiabatic section to the micro-structures in the condenser section to facilitate the condensation process. Working fluid converted back to the liquid state is then recirculated via the return micro-structures in the adiabatic section back to the evaporator section. According to some embodiments, flow-directing features are incorporated in the microfluidic distribution apparatus to facilitate a substantially uniform flow of the working fluid through the evaporator and condenser sections.

According to an embodiment, the microfluidic distribution apparatus and optoelectronic device are arranged in a vertical orientation with the evaporator section being positioned below the condenser section such that distribution of the working fluid from the evaporator section toward the condenser section is facilitated by a buoyancy force and distribution of the working fluid from the condenser section toward the evaporator section is facilitated by a gravity force. According to another embodiment, the microfluidic distribution apparatus and optoelectronic device are arranged in a horizontal orientation with the plurality of micro-structures joined together to form a multi-turn continuous loop in a serpentine configuration comprising a plurality of U-turns distributed between the evaporator, adiabatic, and condenser sections.

According to some embodiments, artificial nucleation sites (e.g., perturbations in micro-structure surfaces, other micro-structures, etc.) facilitate distribution of the working fluid from the evaporator section toward the condenser section, in either horizontal or vertical orientations, by two-phase flow instabilities.

In one embodiment, the optoelectronic device is a comb laser source assembly comprising a plurality of reflective semiconductor optical amplifiers (RSOAs) and a wavelength multiplexer/demultiplexer, wherein the microfluidic distribution apparatus is positioned in the embedded arrangement with the optoelectronic device such that the RSOAs are substantially aligned with the evaporator section to facilitate heat transfer from the RSOAs into the evaporator section.

According to another embodiment, a system for cooling an optoelectronic device comprises a double-loop implementation in which a first cooling loop and a second cooling loop are provided, each of which comprises a microfluidic distribution apparatus as described above. The first and second cooling loops are adjacently joined in a side-by-side configuration separated by a wall structure and are configured in one embodiment such that that the direction of flow of the working fluid in the first cooling loop is counter to a direction of flow of the working fluid in the second cooling loop (e.g., counter-clockwise and clockwise).

These and additional features provided by the embodiments described herein will be more fully understood in view of the following detailed description, in conjunction with the drawings.

DETAILED DESCRIPTION

Figure 1:
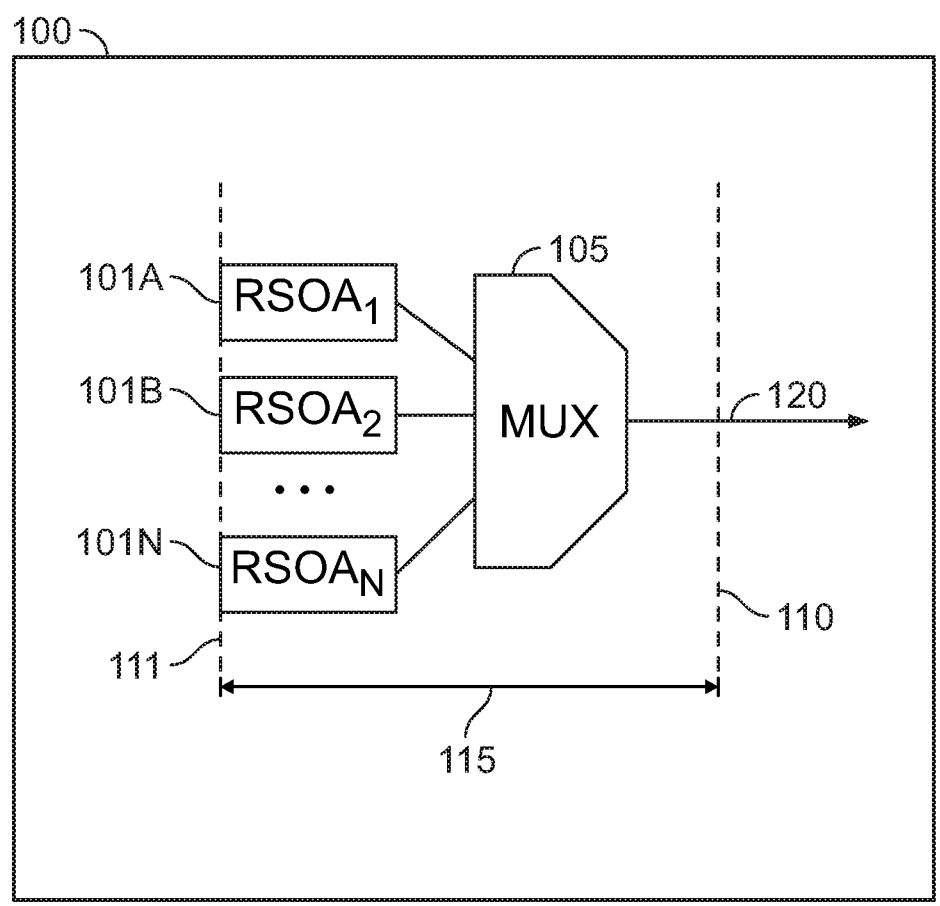
FIG. 1 shows a schematic of an optoelectronic device.

Various illustrative embodiments will now be described more fully with reference to the accompanying drawings in which some of the illustrative embodiments are shown. It should be understood, however, that there is no intent to limit illustrative embodiments to the particular forms disclosed, either in the drawings or in the rest of this disclosure, but on the contrary, illustrative embodiments are intended to cover all modifications, equivalents, and alternatives falling within the scope of the claims. Where appropriate, like numbers refer to like elements throughout the description of the figures. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of illustrative embodiments. As used herein, the term "and/or" includes any and all combinations of one or more of the associated listed items.

As used herein, the term "embedded", is to be understood to refer to any one structure (e.g., a microfluidic apparatus), joining with another structure (e.g., an optoelectronic device), by any means such that the one structure is attached to, fixed with, incorporated in, integrated into, or in any other manner that is in thermal and mechanical contact with the other structure such that the two structures form one integral body.

Herein, a vertical orientation is to be understood to refer to an orientation parallel to the direction of gravity, while horizontal orientation is one that is perpendicular to the vertical orientation.

Optoelectronic devices have become more and more challenging to cool because of the continued trend toward highly integrated devices in which an increasing number of components are included in a more compact package, thus generating higher heat density dissipations. According to the various embodiments described herein, an embedded microfluidic distribution apparatus is used to passively remove heat from an optoelectronic device in a manner that overcomes the disadvantages of some solutions, e.g., TECs. For example, TECs consume power, which can be significant in some cases, and generally exhibit low energy efficiency, e.g., typically no greater than 10% to 15%. Moreover, TECs can typically only dissipate limited heat fluxes from the target heat-generating components. TECs can also add significant cost to a system, especially as more customization is required. Multi-stage, cascaded TEC configurations have also been used to increase heat removal capability, however, such an approach is typically not feasible or practical as optoelectronic devices are becoming highly integrated to meet space, cost and efficiency requirements.

One such example of an optoelectronic device that can be cooled according to the various embodiments is a comb laser (also referred to as a comb source), which includes a plurality of heat-generating components (e.g., RSOAs). Other examples of optoelectronic devices, configurations and integrated structures that can benefit from the passive heat removal provided by the embodiments described herein (e.g., to replace TEC-based cooling implementations) include, but are not limited to: (1) an electronic driver packaged with an electro-optic modulator, e.g., arrays of drivers-modulators in an optical transmitter device; (2) an optical photodetector packaged with a transimpedance amplifier (TIA), e.g., arrays of photodetectors-TIAs in an optical receiver device; (3) an electronic driver packaged with a laser (e.g., a directly modulated laser, an externally modulated laser or vertical-cavity surface-emitting laser (VCSEL), a semiconductor amplifier, etc.), e.g., arrays of drivers-lasers in an optical transmitter device; (4) optical circuits that use high levels of optical power (e.g., for nonlinear applications); (5) electronic circuits packaged with optical chips to manage control functionalities such as wavelength tuning and/or feedback control of the components on the optical chip; and many others. Accordingly, any embodiments described herein are meant to be illustrative only and not limiting in any manner.

For ease of description, the various embodiments will be described in the context of a comb source as the optoelectronic device. Generally, a comb source generates a number (N) of continuous wave (CW) optical signals at wavelengths $\lambda_1, \lambda_2, \ldots \lambda_N$ with a fixed wavelength spacing and can be used, for example, in wavelength division multiplexed (WDM) applications and systems.

FIG. 1 shows a simplified schematic of a comb source 100 that includes a plurality of reflective semiconductor optical amplifiers (RSOAs) 101A, 101B and 101N corresponding to $RSOA_1$, $RSOA_2$ and $RSOA_N$, respectively, which are the N active elements. As shown, RSOAs 101A-101N are inserted in a lasing cavity 115 formed by a first mirror 110, which is partially reflective, and a second mirror 111, which has reflectivity as close as possible to 100% (e.g., typically implemented by coating a back-facet of the active elements (i.e., RSOAs 101A-101N) with a so-called "perfect" reflector. The comb source 100 also includes an optical multiplexer 105, which is inserted in the lasing cavity 115, to spectrally select wavelengths $\lambda_1, \lambda_2, \ldots \lambda_N$ from the broadband spectrum of RSOAs 101A-101N and to combine them on the same output waveguide 120.

In a common implementation of the comb source 100, the optical multiplexer 105 can be implemented as an arrayed waveguide grating (AWG) in silica-on-silicon technology. Other technologies, such as, for example, silicon, silicon nitride, indium phosphide, polymer-based, lithium niobate, etc., are also commonly used to fabricate an optical multiplexer. The partially reflective first mirror 110 may be implemented with a Sagnac loop. The RSOAs 101A-101N may be implemented in III-V technology and coupled to the AWG 105 by means of lenses or through butt-coupling approaches. These examples are meant to be illustrative. In other cases, the optical multiplexer 105 may be implemented using echelle gratings, ring resonators or Mach-Zehnder interferometers. The partially reflective first mirror 110 may also be implemented with Bragg gratings or lumped reflectors. The RSOAs 101A-101N may also be integrated together in an array.

The output power of each wavelength channel of the comb source 100 depends on the optical gain of each RSOA 101A-101N with respect to the optical loss of the lasing cavity 115. The gain of RSOAs 101A-101N depends on the electrical current applied to each RSOA and on the materials and geometry of each RSOA. One of the main challenges is the thermal management of the comb source 100, especially when the channel count increases. For example, each RSOA in comb source 100 may consume approximately 600 mW of electrical power to obtain an output optical power of approximately 10 mW per channel. For the case of N=16, the overall power consumption of the device can therefore be significant (approximately 9.6 W in total) over a device footprint area of only 0.12 $cm^2$, which can therefore result in a heat flux of approximately 80 W/$cm^2$. For such highly integrated, densely packed devices such as comb source 100, typical thermal management solutions using TECs suffer from the aforementioned disadvantages (e.g., energy inefficiency, power consumption, cost, lack of scalability to handle greater heat density dissipation, etc.).

Figure 2A:
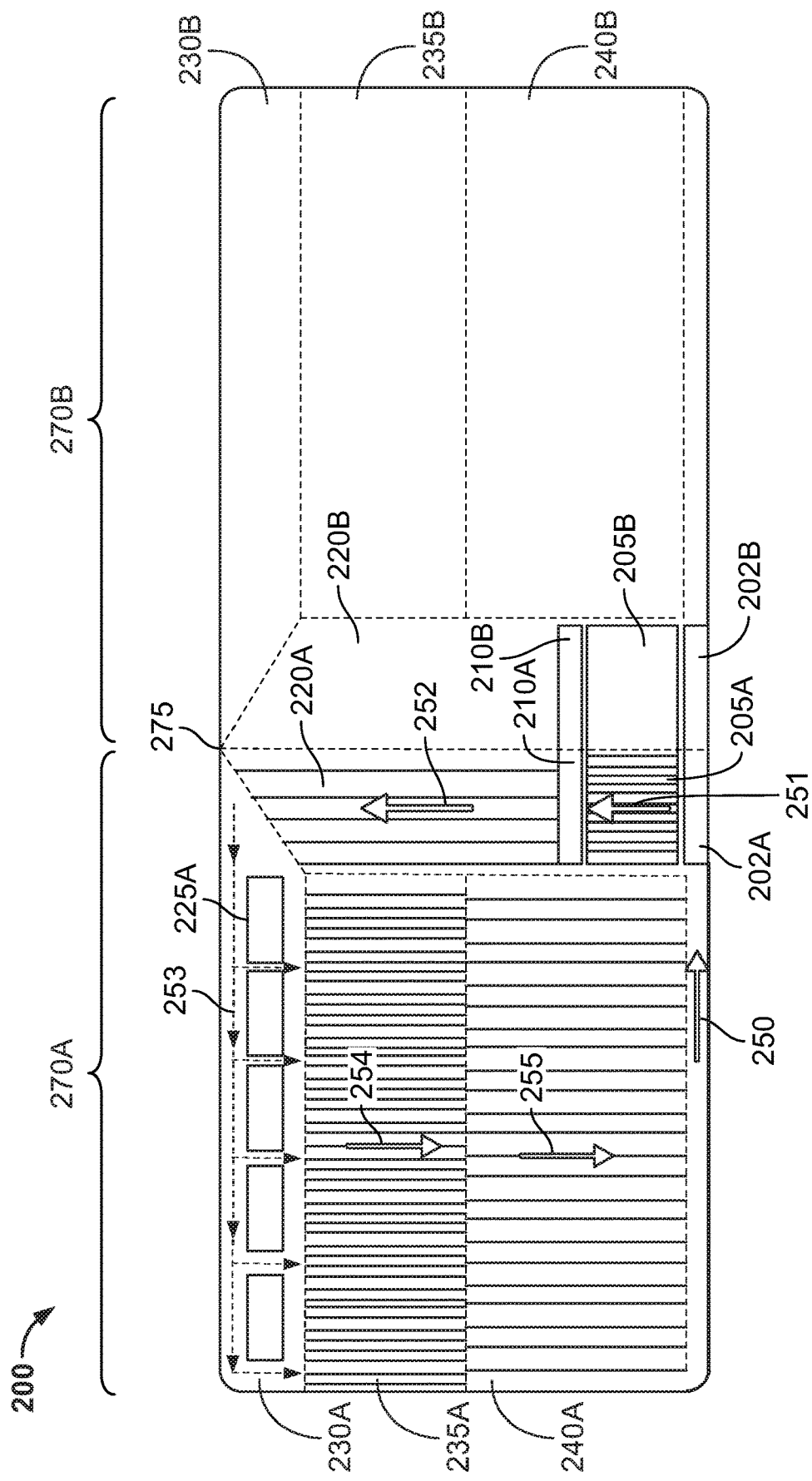
FIG. 2A shows a schematic in a top view of the microfluidic distribution apparatus according to an illustrative embodiment.

FIG. 2A shows an illustrative embodiment of an apparatus for cooling an optoelectronic device, such as comb source 100. More specifically, FIG. 2A shows a top view of microfluidic distribution apparatus 200 in a double loop configuration that includes a first cooling loop 270A (left side) and a second cooling loop 270B (right side) adjacently joined in a side-by-side configuration separated by a wall structure 275. As will be described in further detail below, the first cooling loop 270A and the second cooling loop 270B comprise the same elements and functionality, but in a mirrored/parallel configuration. For ease of illustration and explanation of the various elements in each of the first and second cooling loops 270A and 270B, certain features are not explicitly shown in detail for the second cooling loop 270B. However, the components and operation of the first and second cooling loops 270A and 270B are similar, except as will be specifically noted below.

As shown, microfluidic distribution apparatus 200 (in the first cooling loop 270A) includes an evaporator inlet header section 202A, a micro-scale evaporator section 205A, an evaporator outlet header section 210A, feeder channels 220A (adiabatic section), condenser distributor section 230A, micro-scale condenser section 235A, and return channels 240A (adiabatic section). The condenser distributor section 230A further includes a plurality of flow-directing structures and/or features 225A. Similarly, as shown in second cooling loop 270B, a mirrored arrangement of the same components shown in the first cooling loop 270A are also present. More specifically, microfluidic distribution apparatus 200 (in the second cooling loop 270B) includes an evaporator inlet header section 202B, a micro-scale evaporator section 205B, an evaporator outlet header section 210B, feeder channels 220B (adiabatic section), condenser distributor section 230B, micro-scale condenser section 235B, and return channels 240B (adiabatic section).

As implied, the microfluidic distribution apparatus 200 operates on the principles of microfluidics, e.g., control and manipulation of fluids that are geometrically constrained, e.g., typically in millimeter, sub-millimeter scale, and governed by other factors (e.g., geometry of micro-structures, characteristics of the phase change mechanisms, etc.). As shown in FIG. 2A for one embodiment, each of micro-scale evaporator section 205A, feeder channels 220A (adiabatic section), micro-scale condenser section 235A, and return channels 240A (adiabatic section) comprise one or more microfluidic paths formed or defined therein for distributing (or routing) the working fluid. One advantage of microfluidic routing of the working fluid, for example, is more uniform flow distribution through the various components and to provide a more uniform cooling capability on the target device (e.g., comb source 100). The distribution of the working fluid in phase change (e.g., in liquid form and two-phase liquid-vapor form) will be discussed in further detail below.

Various micro-structures may be suitably used in the embodiments described herein and it would be a matter of design choice based on various factors, including but not limited to: the cooling requirements to be achieved based on the heat densities/fluxes generated by the optoelectronic device (e.g., target heat dissipation); the type of working fluid to be used; the structural configuration and orientation (vertical, horizontal) of the integrated optoelectronics device/structure; fabrication techniques; and so on.

By way of example and not limitation, the flow paths in the evaporator section 205A and condenser section 235A may be formed by (or defined by) micro-structures that may include: micro-channels, micro-fins (e.g., having a rectangular or circular cross-sectional shape); micro-pin fins (e.g., having a rectangular or circular cross-sectional shape); an in-line array of micro-pin fins (e.g., having a rectangular or circular cross-sectional shape); and/or a staggered array of micro-pin fins (e.g., having a rectangular or circular cross-sectional shape). It is also contemplated that various combinations of different micro-structures (such as various combinations of those described above) may be used to design the evaporator section 205A and the condenser section 235A. Similarly, any of the aforementioned micro-structures may be suitably used for the evaporator inlet header section 202A, the evaporator outlet header section 210A, the condenser distributor section 230A, the feeder channels 220A and the return channels 240A. In one embodiment, feeder channels 220A and return channels 240A comprise straight micro-channels to optimize adiabatic flow distribution. For ease of reference, the term micro-structures is used in the broadest sense to encompass various structures, as described above, in a non-limiting manner.

Returning to FIG. 2A, the plurality of micro-structures in evaporator inlet header section 202A, micro-scale evaporator section 205A, evaporator outlet header section 210A, feeder channels 220A (adiabatic section), condenser distributor section 230A, micro-scale condenser section 235A, and return channels 240A (adiabatic section) together form an enclosed (e.g., closed loop), recirculating fluid distribution circuit in first cooling loop 270A. The plurality of micro-structures in the corresponding components in the second cooling loop 270B also form an enclosed (e.g., closed loop), recirculating fluid distribution circuit, which is separated from the enclosed, recirculating fluid distribution circuit of the first cooling loop 270A by a wall structure 275 (e.g., walled off by wall structure 275). In this manner, the evaporator inlet header section 202A, micro-scale evaporator section 205A, evaporator outlet header section 210A, feeder channels 220A (adiabatic section), condenser distributor section 230A, micro-scale condenser section 235A, and return channels 240A (adiabatic section) are in fluid communication with each other, as shown by flows 250, 251, 252, 253, 254 and 255. For example, the micro-scale evaporator section 205A is in fluid communication with the micro-scale condenser section 235A via evaporator outlet header section 210A, feeder channels 220A (adiabatic section) and condenser distributor section 230A, and so on.

Figure 2B:
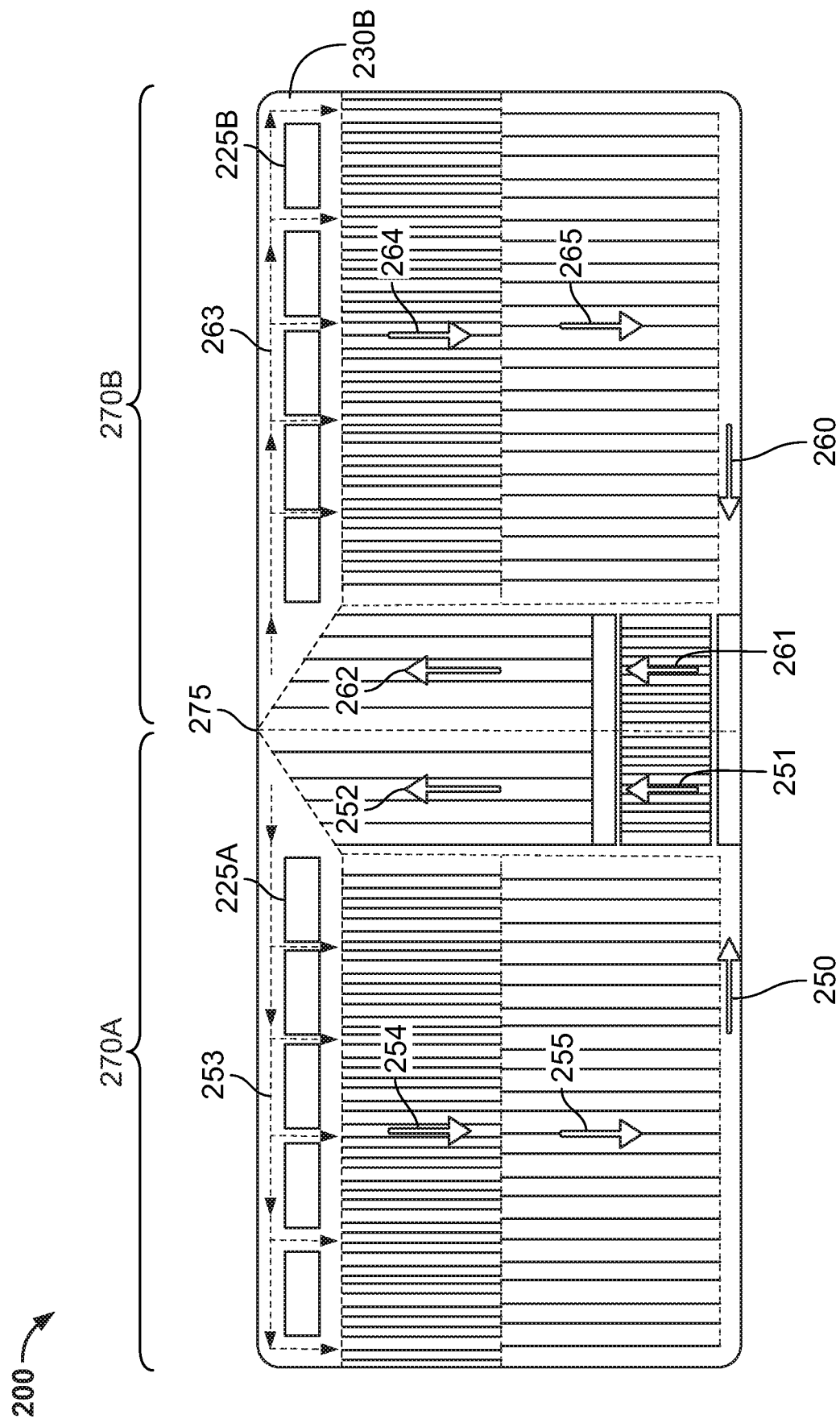
FIG. 2B shows a schematic in a top view of the microfluidic distribution apparatus from FIG. 2A with further illustrative details according to an embodiment.

As shown in FIG. 2B, which is the same embodiment shown in FIG. 2A (but with the additional micro-structures shown), the corresponding components of the microfluidic distribution apparatus 200 in the second cooling loop 270B are in fluid communication with each other as shown in FIG. 2B with flows 260, 261, 262, 263, 264 and 265. For example, the micro-scale evaporator section 205B is in fluid communication with the micro-scale condenser section 235B via evaporator outlet header section 210B, feeder channels 220B (adiabatic section) and condenser distributor section 230B, and so on. FIG. 2B also shows flow-directing structures and/or features 225B for condenser distributor section 230B. As shown, according to an embodiment, the first cooling loop 270A and the second cooling loop 270B are configured such that the direction of the flow of the working fluid in the first cooling loop 270A is counterclockwise, which is counter to the clock-wise direction of flow of the working fluid in the second cooling loop 270B.

Figure 2C:
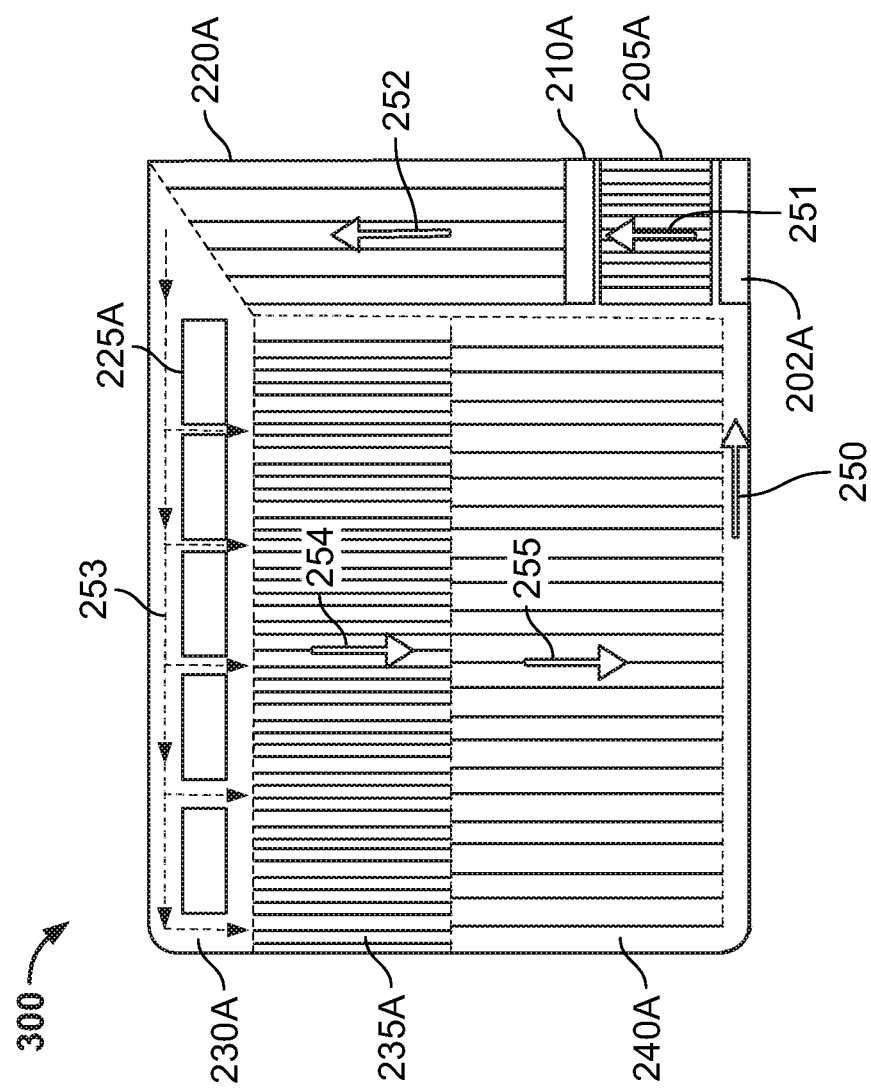
FIG. 2C shows a schematic in a top view of a variation of the microfluidic distribution apparatus from FIGS. 2A and 2B according to an illustrative embodiment.

FIG. 2C shows a top view of the microfluidic distribution apparatus 300 in a single loop configuration. The various components shown in FIG. 2C correspond to the components in the first cooling loop 270A from the embodiments in FIGS. 2A and 2B and they will not be described again for the sake of brevity. Instead, the single loop configuration of microfluidic distribution apparatus 300 is being shown for completeness.

As compared with the single loop configuration in FIG. 2C, the double loop configuration from FIGS. 2A and 2B may be useful for reducing overall two-phase pressure drops compared to the single loop, which could be beneficial for achieving higher passive flow circulation. The double loop configuration can also be further customized. For example, the width of the micro-structures (e.g., parallel micro-channels) of feeder channels 220A and 220B (adiabatic section) may be the same as the width of those in the return channels 240A and 240B (adiabatic section) in one implementation and the micro-scale condenser sections 235A and 235B can be optimized according to the target heat dissipation from the heat-generating components of the optoelectronic device (e.g., the RSOAs 101A-101N in the comb source 100). In particular, the optimization of the micro-scale condenser sections 235A and 235B can be achieved by changing the aspect ratio of the micro-structures (e.g., condenser fins) and/or by increasing or reducing the total heat transfer area, e.g., the higher thermal resistance of the microfluidic distribution apparatus 200 is given by the condenser sections 235A and 235B because the working fluid in two-phase liquid-vapor is condensed by air in natural convection using both the front and back sides.

In operation, the microfluidic distribution apparatus 200 (and 300) is configured to distribute a working fluid in phase change to passively remove heat from the optoelectronic device. Referring back to FIG. 2A, the working fluid is distributed in a liquid state through the plurality of micro-structures in the evaporator section 205A, where the working fluid converts to a two-phase liquid-vapor state to remove heat generated by the optoelectronic device via an evaporation process. The working fluid in the two-phase liquid-vapor state is then distributed through the plurality of feeder channels 220A in the adiabatic section to the plurality of micro-structures in the condenser section 235A to passively dissipate latent heat in the two-phase liquid-vapor to air in natural convection via condensation. The working fluid converts from the two-phase liquid-vapor state back to the liquid state for recirculation via the plurality of returning channels 240A in the adiabatic section back to the evaporator section 205A.

The distribution of the working fluid can be facilitated using different phase change mechanisms depending on the orientation of the embedded arrangement of the microfluidic distribution apparatus 200 and the optoelectronic device, e.g., comb source 100. For example, the microfluidic distribution apparatus 200 and optoelectronic device (e.g., comb source 100) can be arranged in a vertical orientation, where the evaporator section 205A is positioned below the condenser section 235A. With this configuration, the distribution of the working fluid in the two-phase liquid-vapor state from the evaporator section 205A toward the condenser section 235A is facilitated by a buoyancy force while the distribution of the working fluid in the liquid state returned from the condenser section 235A toward the evaporator section 205A is facilitated by a gravity force. So, for vertically-oriented devices (e.g., comb source 100), heat is guided from the evaporator section 205A to the condenser section 235A through the feeder channels 220A in the adiabatic section (also referred to as "rising" channels in a vertical configuration) using a phase change mechanism that utilizes the balance between the buoyancy force (from the vapor generated in evaporator section 205A) and the gravity force (liquid generated in condenser section 235A).

Figure 3:
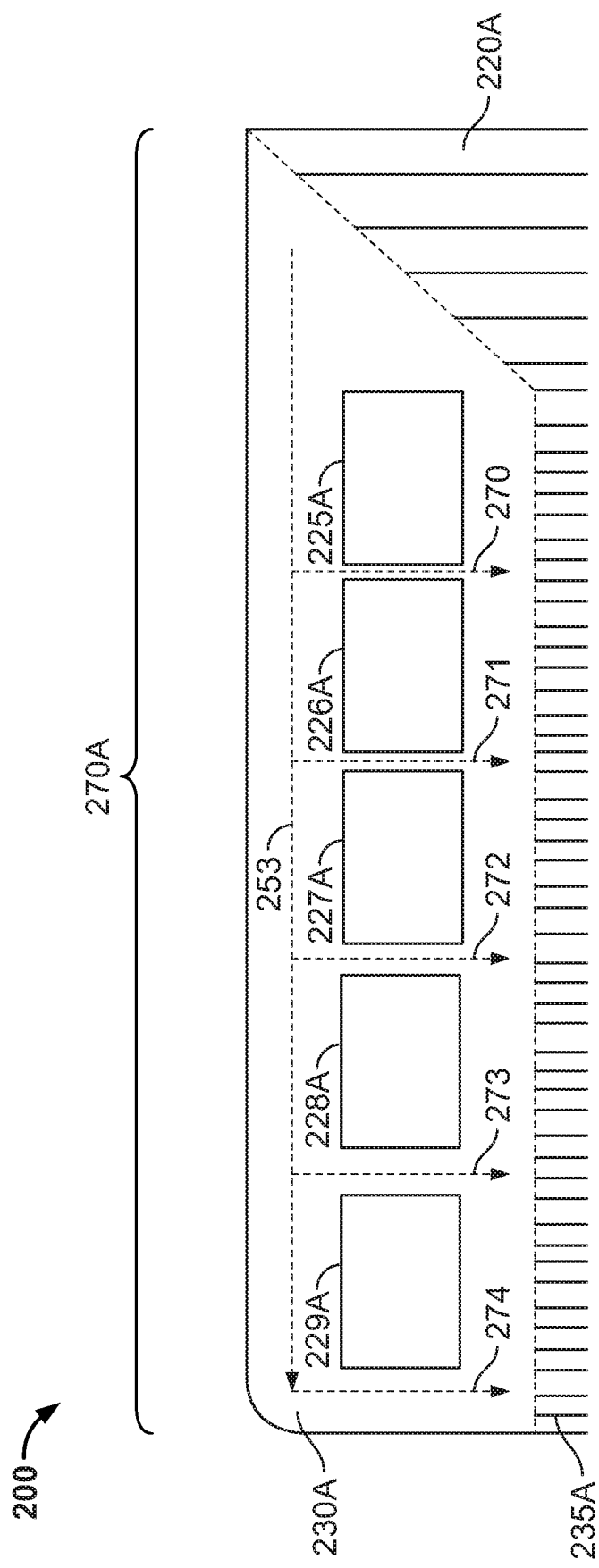
FIG. 3 shows a schematic in a top view of an illustrative configuration of elements for a condenser distributor section for use with the embodiments shown in FIGS. 2A, 2B and 2C.

Flow-directing structures and/or features can be incorporated according to various embodiments to further direct or otherwise manipulate the flow of the working fluid through different components of the microfluidic distribution apparatus 200. For example, as shown in FIG. 3 for one embodiment, the condenser distributor section 230A may include a plurality of flow-directing structures 225A, 226A, 227A, 228A and 229A for controlling the flow of the working fluid from the feeder channels 220A into the condenser section 235A. In one example, flow-directing structures 225A-229A may include, but are not limited to, rectangular micro-fins.

Flow-directing structures 225A-229A can have variable spacing therebetween, e.g., such that a respective spacing between adjacent flow-directing structures increases moving in the direction of the flow of the working fluid (e.g., the working fluid flowing from the feeder channels 220A). As shown, the spacing between the flow-directing structures 225A and 226A is less than the spacing between flow-directing structures 226A and 227A, which is less than the spacing between flow-directing structures 227A and 228A, and so on. In this manner, the flow 253 from the feeder channels 220A can be controlled to facilitate a substantially uniform flow (e.g., amount and speed of flow) of the working fluid (shown by flows 270, 271, 272, 273 and 274) in the two-phase liquid-vapor state into the plurality of micro-structures of the condenser section 235A. For example, when the spacing (e.g., width) between the flow-directing structures 225A-229A is increased as shown, flow velocity is reduced thus reducing the pressure drop locally, which enables a more uniform flow through the condenser section 235A. These flow-directing structures 225A-229A therefore can assist with more uniform distribution of the working fluid passing into the condenser section 235A, thus mitigating the two-phase frictional pressure drops as a function of the hydrodynamic length.

Figure 4:
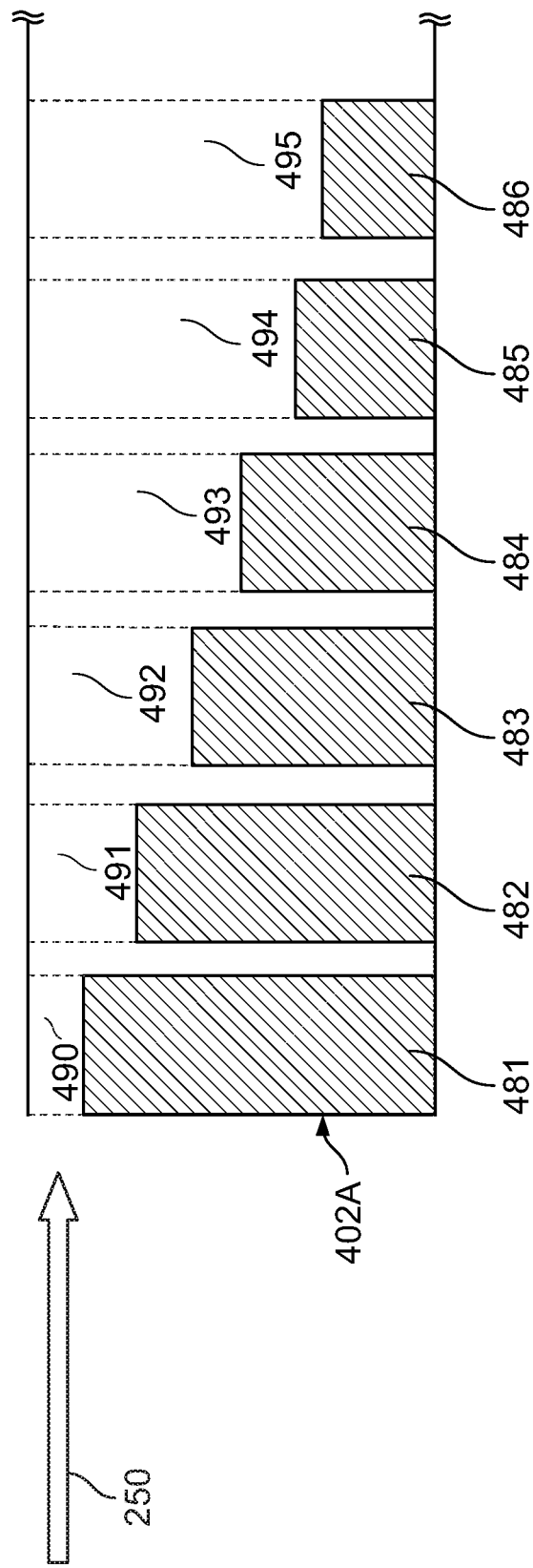
FIG. 4 shows a cross-sectional view of an illustrative configuration of elements for an evaporator inlet header section for use with the embodiments shown in FIGS. 2A, 2B and 2C.

In another embodiment shown in FIG. 4, the evaporator inlet header section 402A (corresponding to evaporator inlet header section 202A in FIG. 2A) can be designed with a plurality of flow-directing structures having variable cross-sectional areas to reduce two-phase flow instabilities. More specifically, such flow-directing structures can be helpful for facilitating a substantially uniform flow of the working fluid in the liquid state from the return channels 240A (FIG. 2A) in the adiabatic section into the micro-structures of the evaporator section 205A and for controlling backflow of the working fluid from the evaporator section 205A back into the return channels 240A in the adiabatic section. FIG. 4 shows a cross-sectional view as viewed across the width of evaporator inlet header section 402A (e.g., corresponding to the bottom edge of evaporator inlet header section 202A shown in FIGS. 2A, 2B and 2C). In this embodiment, the evaporator inlet header section 402A includes flow-directing structures 481, 482, 483, 484, 485, 486. The flow-directing structures 481-486 can be micro-structures having variable cross-sectional areas that decrease moving in the direction of the flow of the working fluid (e.g., the incoming flow 250 of the working fluid from the return channels 240A). As shown, the cross-sectional area of the flow-directing structure 481 is greater than the cross-sectional area of flow-directing structure 482, which is greater than the cross-sectional area of flow-directing structure 483, and so on. In this manner, the flow 250 from return channels 240A can be controlled to facilitate a substantially uniform flow (e.g., amount and speed of flow as described previously) of the working fluid (shown by flow 451) in the liquid state through the plurality of micro-structures of evaporator section 205A. More specifically, the increased cross-sectional area of flow-directing structure 481 results in a smaller open area 490 for fluid flow toward the evaporator section 205A (not explicitly shown), thus providing more resistance to the incoming flow 250 (from return channels 240A) to prevent against more working fluid entering directly and non-uniformly into the nearest micro-structure of evaporator section 205A (not explicitly shown). The subsequent flow-directing structures 482-486 similarly control the flows through the respective open areas (represented by 491-495, respectively) entering into the evaporator section 205A. These flow-directing structures 481-486 therefore control the flow across the width of evaporator section 205A and they can assist with achieving higher thermal performance and more uniform cooling.

In another embodiment (not explicitly shown), the flow-directing structures in the evaporator inlet header section 202A may include a plurality of apertures that are in fluid communication with the micro-structures in the evaporator section 205A. Similar in concept to the previous embodiment, the diameters of the plurality of apertures can increase in size moving in the direction of the flow of the working fluid (e.g., the incoming flow 250 of the working fluid) from the return channels 240A in the adiabatic section, to again control the amount of working fluid entering into the micro-structures in evaporator section 205A to facilitate more uniform flow and also to control backflow as previously described.

In another embodiment (not explicitly shown), the flow-directing structures in the evaporator inlet header section 202A may include one or more micro-structures (e.g., micro-pin fins, etc.) positioned at or near apertures that are in fluid communication with the micro-structures in the evaporator section 205A. Similar in concept to the previous embodiments, the placement and size of the micro-structures (such as micro-pin fins) can be used to restrict and/or redirect the flow of the working fluid to facilitate more uniform flow across and through the evaporator section 205A as described above. In this example, and again similar in concept as described above, the micro-structures (e.g., micro-pin fins) may decrease in size moving in the direction of the working fluid flowing from the return micro-structures 240A.

According to another aspect, various micro-structure configurations may be utilized for the various sections of microfluidic distribution apparatus 200 (e.g., from FIG. 2A) to improve the cooling capability based on the target heat density dissipation. FIGS. 5A, 5B, 6A, 6B, 7A, 7B and 7C show various illustrative embodiments, but are not meant to be limiting in any way as other micro-structures can be suitably used.

Figure 5B:
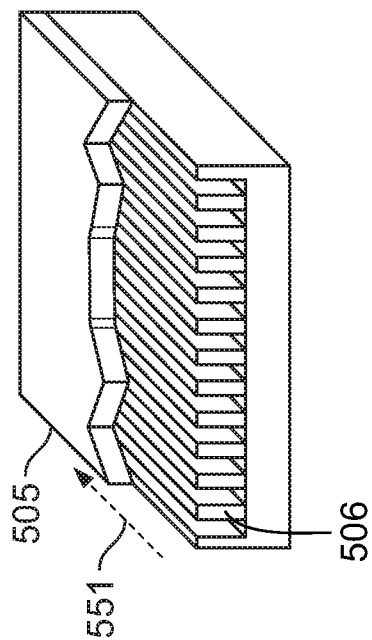
FIG. 5A shows a top view and FIG. 5B shows a perspective view of an illustrative configuration of micro-structure elements for use with the embodiments shown in FIGS. 2A, 2B and 2C.
Figure 5A:
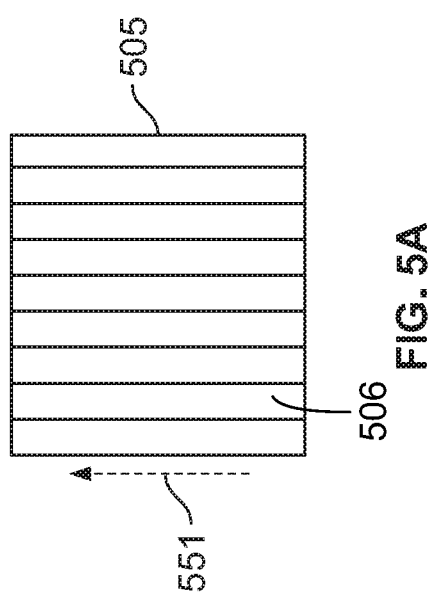

For example, FIG. 5A shows a top view of a simplified schematic of the evaporator section 505 with direction of flow 551 of the working fluid in the two-phase liquid-vapor state. In the example shown in FIG. 5A, the evaporator section 505 includes parallel micro-channels 506, which can have various geometries (e.g., fins with different aspect ratios, widths, base thicknesses). FIG. 5B shows a perspective view of the evaporator section 505 from FIG. 5A.

Figure 6B:
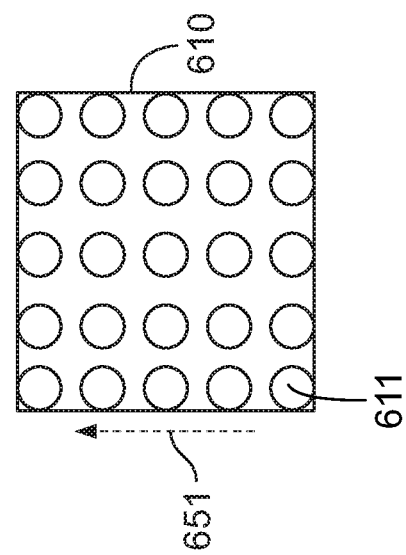
FIG. 6A and FIG. 6B show top views of illustrative configurations of micro-structure elements for use with the embodiments shown in FIGS. 2A, 2B and 2C.
Figure 6A:
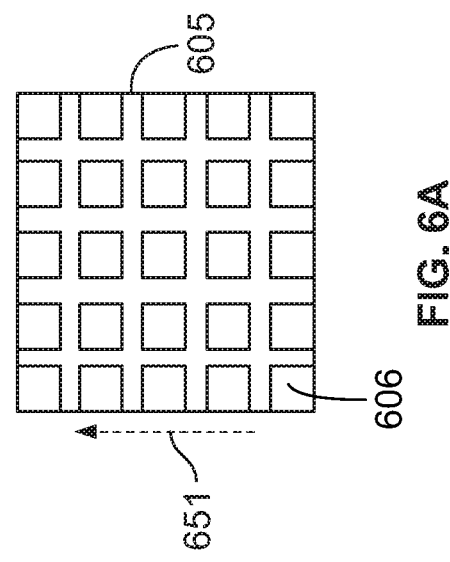

FIG. 6A shows a top view of a simplified schematic of the evaporator section 605 with direction of flow 651 of the working fluid in the two-phase liquid-vapor state. In the example shown in FIG. 6A, evaporator section 605 includes an array of in-line, rectangular micro-pin fins 606, which can be obtained, for example, via a 90° cross-cutting of the parallel micro-channels (from FIGS. 5A, 5B). FIG. 6B shows a similar configuration as FIG. 6A, but shown as evaporator section 610 with an array of in-line, circular micro-pin fins 611.

Figure 7B:
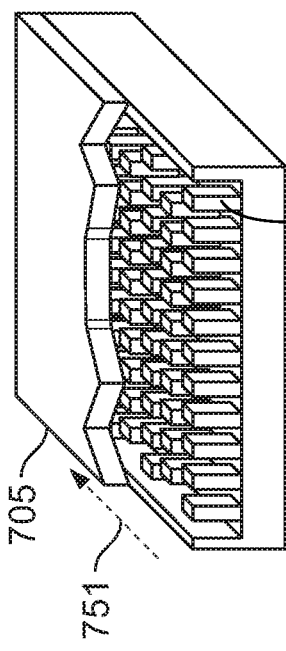
FIG. 7B shows a perspective view.
Figure 7C:
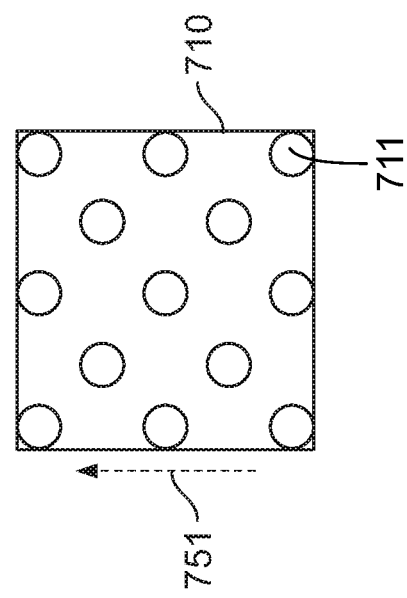
FIG. 7C shows a top view of illustrative configurations of micro-structure elements for use with the embodiments shown in FIGS. 2A, 2B and 2C.
Figure 7A:
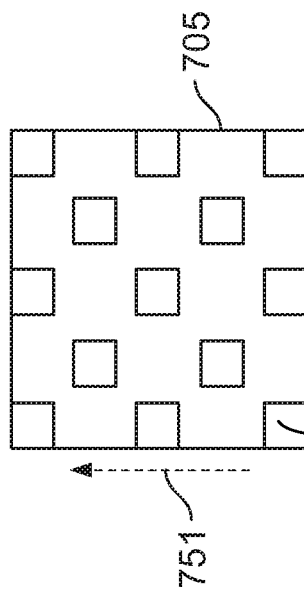
FIG. 7A shows a top view.

FIG. 7A shows a top view of a simplified schematic of the evaporator section 705 with direction of flow 751 of the working fluid in the two-phase liquid-vapor state. In the example shown in FIG. 7A, evaporator section 705 includes an array of staggered, rectangular micro-pin fins 706, which can be obtained, for example, via a 45° cross-cutting of the parallel micro-channels (from FIGS. 5A, 5B) and refining the edges. FIG. 7B shows a perspective view of the evaporator section 705 from FIG. 7A. FIG. 7C shows a similar configuration as FIG. 7A, but shown as evaporator section 710 with an array of staggered, circular micro-pin fins 711.

The embodiments shown in FIGS. 5A, 5B, 6A, 6B, 7A, 7B and 7C were only described in the context of microstructure design alternatives for an evaporator section. However, the condenser section 235A, the evaporator inlet header section 202A, the evaporator outlet header section 210A, the condenser distributor section 230A, the feeder channels 220A, and the return channels 240A from FIG. 2A may also utilize various micro-structure configurations including, but not limited to those shown and described in FIGS. 5A, 5B, 6A, 6B, 7A, 7B and 7C for the evaporator section. Additionally, it is contemplated that each of the sections in microfluidic distribution apparatus 200 (e.g., from FIG. 2A) may use the same or different combinations of micro-structure configurations, e.g., the same microstructure configuration may be used in each of the various evaporator and condenser sections or a combination/mix of different micro-structure configurations may be used in the various evaporator and condenser sections, by way of example only. Various combinations can also be used in other sections.

Figure 8:
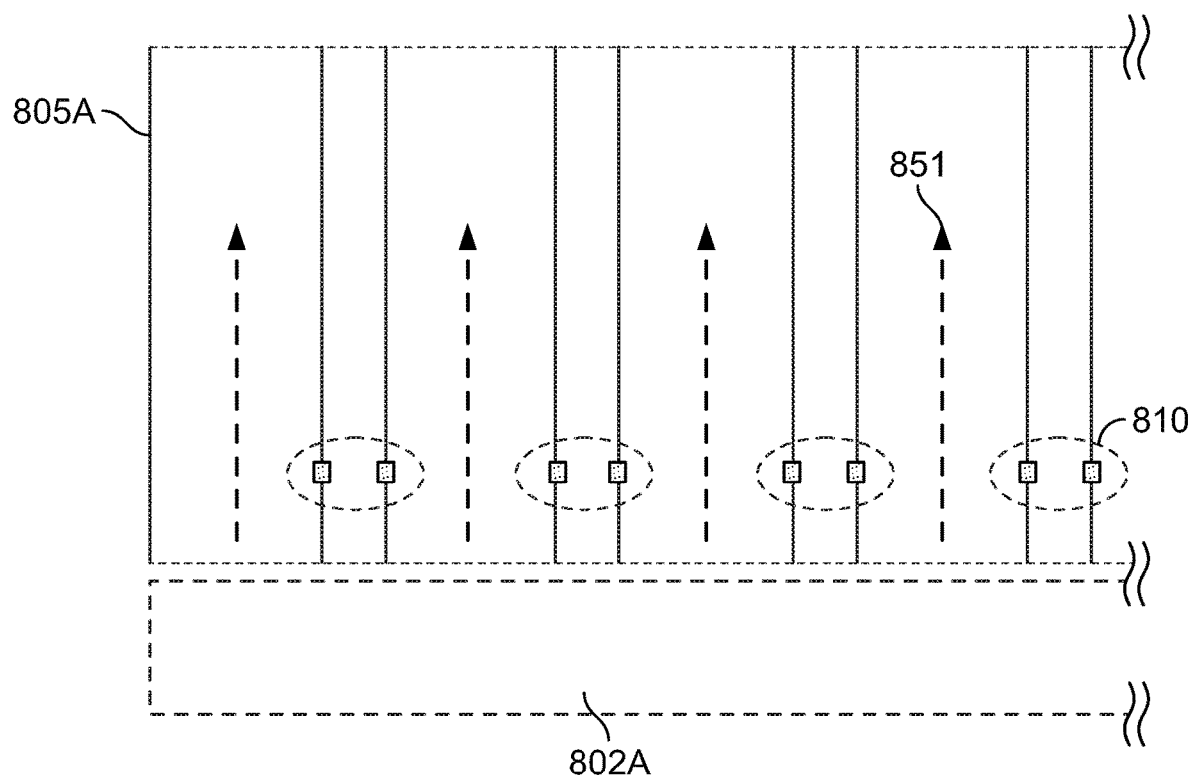
FIG. 8 shows a schematic illustrating nucleation features according to an embodiment.

According to another embodiment shown in FIG. 8, one or more micro-structures in the evaporator section 805A may comprise "artificial" nucleation sites to control the "bubble generation phenomena" and the ratio between single-phase and two-phase length in individual micro-channels. The term "artificial" in this context is meant to refer an element of irregularity along the otherwise smooth, or regular surface of the inner walls of the channels. The artificial nucleation sites can serve to facilitate distribution of the working fluid in the two-phase liquid-vapor state from the evaporator section 805A toward the condenser section 235A (FIG. 2A). As shown in FIG. 8, the evaporator section 805A includes these artificial nucleation sites 810 along the wall surfaces of the micro-structures in the evaporator section 805A. In one embodiment, these artificial nucleation sites 810 may be positioned closer to the evaporator inlet section 802A to have more effect on the flow (shown as flow 851) within the remaining length of the micro-channels of the evaporator section 805A. More specifically, positioning the artificial nucleation sites 810 to facilitate nucleate boiling earlier (e.g., closer to the evaporator inlet section 802A) can trigger two-phase flow (the working fluid in a liquid-vapor state) that traverses a longer remaining length of the evaporator section 805A, thus resulting in a longer two-phase length that maximizes thermal performance. In one example, artificial nucleation sites 810 may be perturbations (e.g., irregularities, bumps, holes or other imperfections in micro-fins, etc.) placed in the thickness and/or along the surface of the micro-structures. Alternatively, the artificial nucleation sites (not explicitly shown) may be other micro-structures (e.g., micro-pin fins) positioned within the evaporator section 805A to facilitate and control the nucleate boiling process.

Distribution of the working fluid can therefore also be facilitated with a phase change mechanism based on two-phase flow instabilities, which uses a balance between thin film evaporation from annular flow (e.g., vapor core and liquid annulus on the micro-channel wall) and nucleate boiling of the working fluid (e.g., onset of boiling and bubble growth mechanisms) in the evaporator section. As previously described, vertical configurations can utilize buoyancy and gravity forces for distribution of the working fluid. However, the phase change mechanism based on two-phase flow instabilities can also be used to drive the flow against gravity to assist in distribution of the working fluid in vertical configurations. However, the phase change mechanism based on two-phase flow instabilities is particularly useful for when the microfluidic distribution apparatus 200 and optoelectronic device (comb source 100) are arranged in a horizontal orientation, in which buoyancy/gravity have a reduced effect as compared to the vertical orientation, as the driving mechanism for distribution of the working fluid.

Figure 9:
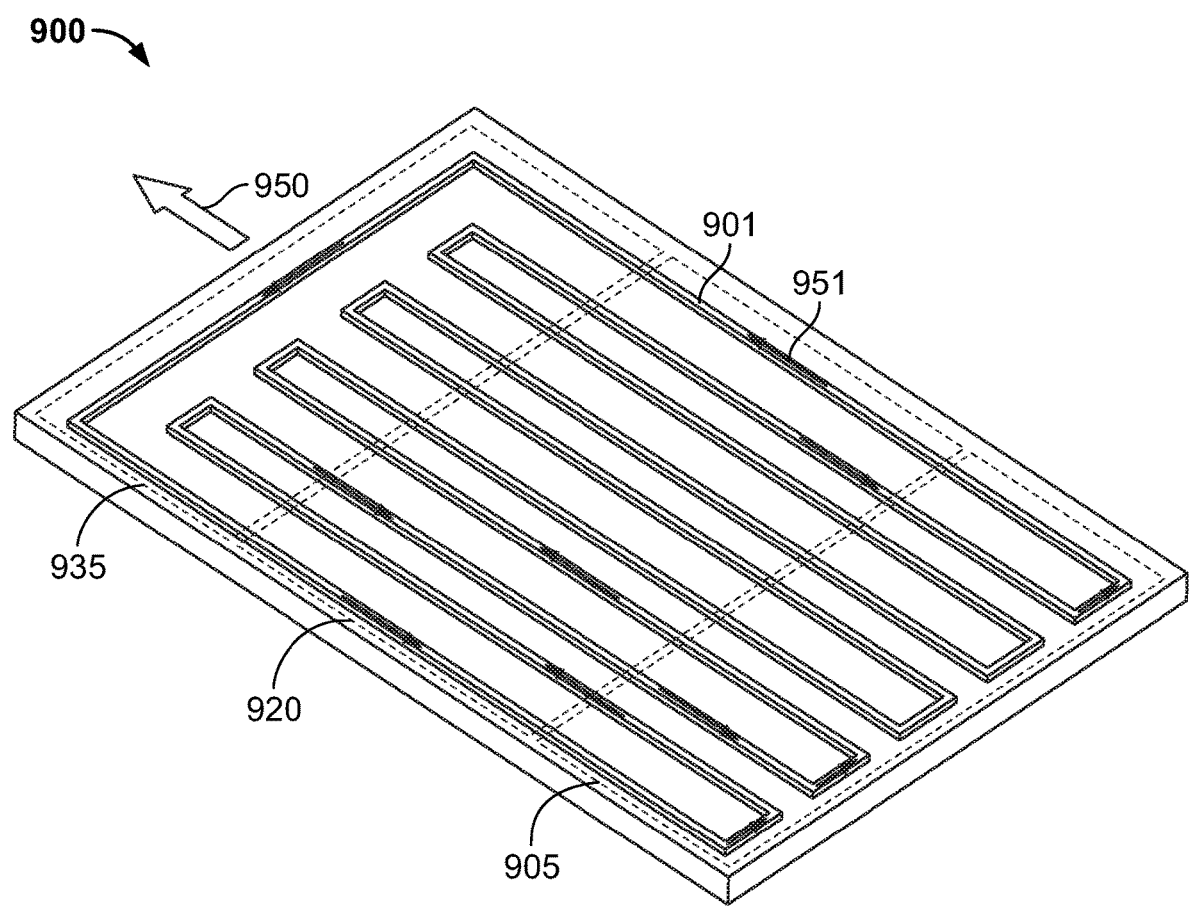
FIG. 9 shows a perspective view of a microfluidic distribution apparatus according to another illustrative embodiment.

FIG. 9 shows a perspective view of a microfluidic distribution apparatus 900 according to an illustrative embodiment for use in configurations where the microfluidic distribution apparatus 900 is embedded with an optoelectronic device (comb source 100) that is arranged in a horizontal orientation. As shown, the plurality of micro-channels 901 are joined together to form a multi-turn continuous loop in a serpentine configuration comprising a plurality of U-turns distributed between an evaporator section 905, an adiabatic section 920, and a condenser section 935. The flow distribution of the working fluid is shown by 951. In this example, heat is removed in the direction of flow 950, e.g., dissipated to condenser section 935. The plurality of micro-channels 901 can be micro-structures having circular or rectangular cross-sectional shape, for example. As described, distribution of the working fluid between evaporator section 905 and condenser section 935 via adiabatic section 920 in the horizontal configuration would be facilitated by two-phase flow instabilities generated from thin film evaporation from annular flow and nucleate boiling of the working fluid in the evaporator section 905.

In certain embodiments, the design layout of the heat-generating components on the optoelectronic device to be cooled (such as RSOAs on a comb source chip assembly) can be taken into consideration for optimizing the thermal performance of the microfluidic distribution apparatus. For example, some design layout considerations for the optoelectronic device may include: (1) optimization of the area occupied by the heat-generating components (e.g., RSOAs) to substantially align with the evaporator footprint in order to minimize two-phase flow maldistributions and associated two-phase flow instabilities; (2) spacing (e.g., symmetrically and with as much spacing as possible) in the layout of the heat-generating components with respect to the main flow direction to improve heat spreading and a uniform cooling effect (e.g., heat flux dissipation is inversely proportion to the surface area); (3) buffer regions as described below (FIG. 10) to provide adiabatic portions for backflow and pre-boiling control; and (4) not allowing the "finned" area of the evaporator to extend beyond the array of RSOAs toward the evaporation outlet header to reduce two-phase pressure drops corresponding flow maldistributions in the feeder channels.

As described above, the microfluidic distribution apparatus 200 (and 300) according to the various embodiments described herein is positioned in an embedded arrangement with the optoelectronic device. In view of the aforementioned design considerations, according to an embodiment (referring to FIGS. 1 and 2A for example), microfluidic distribution apparatus 200 is positioned in an embedded arrangement with comb source 100 such that one or more heat-generating components (e.g., RSOAs 101A-101N) on the comb source 100 are substantially aligned with the evaporator section 205A to facilitate the heat transfer from the RSOAs 101A-101N into the evaporator section 205A.

Figure 10:
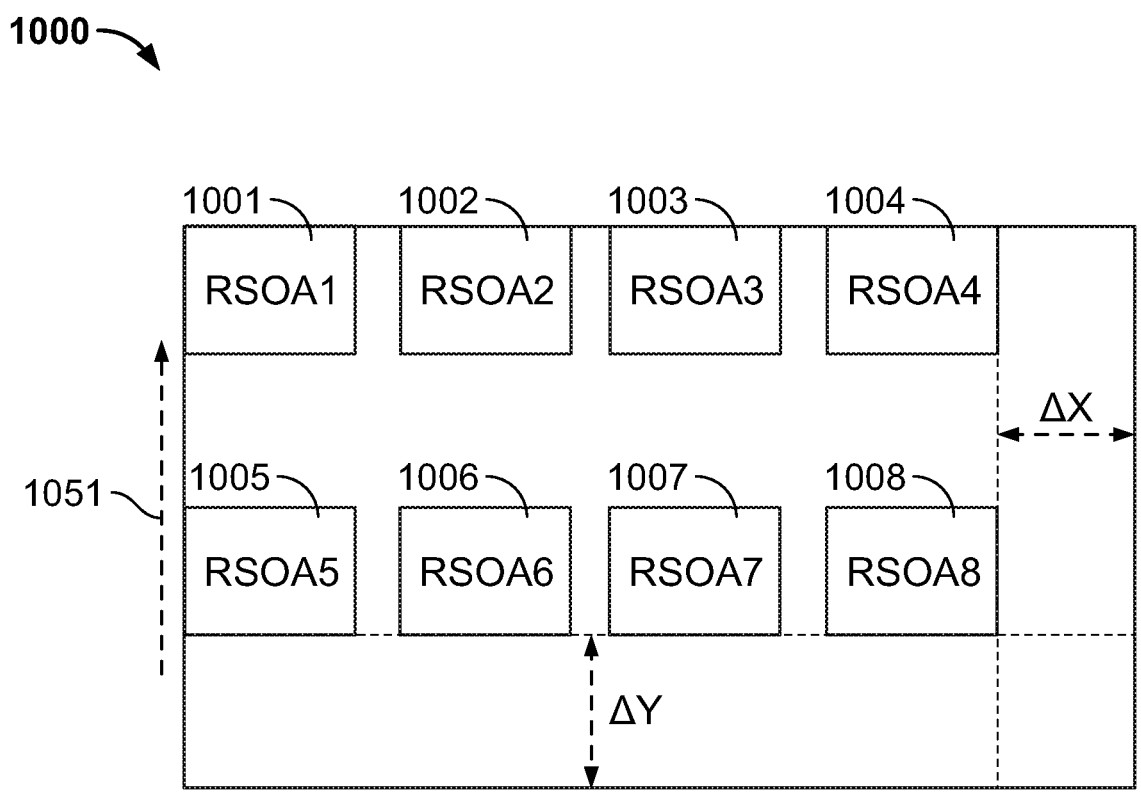
FIG. 10 shows an illustrative configuration of elements (e.g., RSOAs) for an optoelectronic device according to an embodiment.

According to another of the aforementioned design considerations and as illustrated in FIG. 10 (and referring to FIG. 2A), an array of heat-generating RSOAs 1001-1008 is disposed on a chip or substrate 1000 in a vertically-oriented configuration. As described above, RSOAs 1001-1008 are substantially aligned with the evaporator section 205A to facilitate heat transfer from RSOAs 1001-1008 into the evaporator section 205A. As such, flow 1051 matches the direction of flow of the distribution of working fluid in microfluidic distribution apparatus 200. In the embodiment shown in FIG. 10, RSOAs 1001-1008 should be positioned on chip or substrate 1000 in a manner that provides a first buffer region designated by spacing $\Delta Y$ and a second buffer region designated by spacing $\Delta X$ that both function as adiabatic sections. The first buffer region $\Delta Y$ is positioned proximate to a flow input side of the evaporator section 205A for controlling backflow of the working fluid from evaporator section 205A back to evaporation inlet header section 202A. The second buffer region $\Delta X$ is positioned for controlling pre-boiling of the working fluid along surfaces joining the evaporator section 205A and the one or more of the return micro-channels 240A of the adiabatic section. In particular, pre-boiling of the working fluid before it enters the evaporator section 205A and/or backflow of the working fluid from the evaporator section 205A back into the evaporator inlet header section 202A can interfere with or otherwise impede the gravity force that is used to facilitate the passive flow circulation of the working fluid. The first buffer region $\Delta Y$ and the second buffer region $\Delta X$ function as adiabatic sections to prevent or mitigate heat conduction that could otherwise give rise to the aforementioned effects. For example, the second buffer region $\Delta X$ of chip or substrate 1000 is positioned/aligned relative to an adjoining surface or surfaces between evaporator section 205A and the return channels 240A, which serves to mitigate any pre-boiling of the working fluid that may otherwise occur in the return channels 240A as a result of heat conduction from the evaporator section 205A at the adjoining surface(s).

Figure 11:
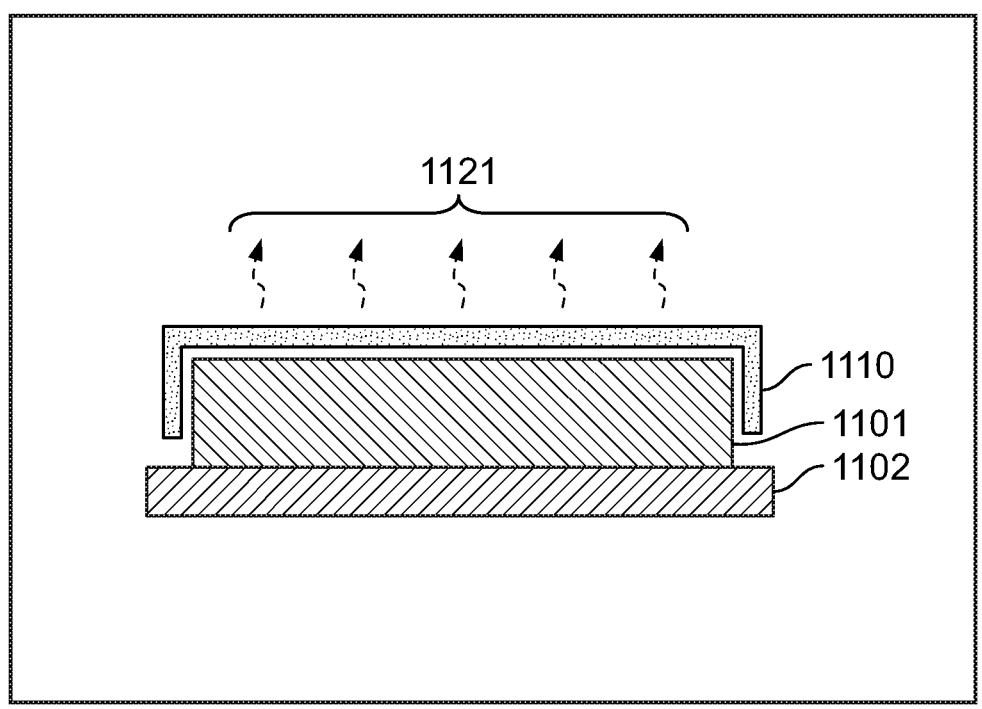
FIG. 11 shows a cross-sectional view of a microfluidic distribution apparatus embedded with an optoelectronic device according to an embodiment.

FIG. 11 shows an example for positioning the microfluidic distribution apparatus in an embedded arrangement within an optoelectronic device according to an embodiment. As shown, optoelectronic device 1100 (which can be a comb source assembly) includes optoelectronic heat source 1101 (which can be the RSOA heat-generating components on the comb source chip). The optoelectronic heat source 1101 is situated on top of microfluidic distribution apparatus 1102. In one embodiment, a layer of thermal insulation material 1110 can be placed on top of optoelectronic heat source 1101 to minimize heat transfer/loss (shown as reference 1121) through the other side that is not in contact with the microfluidic distribution apparatus 1102. In this manner, the heat dissipation can be directed into the microfluidic distribution apparatus 1102 in order to maximize thermal performance and device functionality.

In another embodiment (not explicitly shown), the optoelectronic heat source 1101 and the microfluidic distribution apparatus 1102 can be flipped so that the microfluidic distribution apparatus 1102 is located on the top surface of the optoelectronic heat source 1101. This configuration may be helpful in certain assembly scenarios, e.g., to facilitate mounting of the microfluidic distribution apparatus 1102 after the optical chip (with optoelectronic heat source 1101) has been fixed inside the package of the optoelectronic device 1100.

In another embodiment (not explicitly shown), a layer of thermal interface material (TIM) is situated between the optoelectronic heat source 1101 and the microfluidic distribution apparatus 1102. The selection of an appropriate TIM depends on the thermal requirements and the device functionality. Thickness of the TIM is also a consideration, e.g., minimizing the TIM thickness will provide the best thermal performance. Typically, a guide would also be included to align the TIM with the evaporator section of microfluidic distribution apparatus 1102.

Various standard fabrication methods can be used for constructing the microfluidic distribution apparatus according to the embodiments described herein and are a matter of design choice. In one embodiment, for example, the evaporator section, adiabatic sections (feeder and return channels), and condenser section can be disposed between ceramic plates, e.g., machined on a thin plate of aluminum nitride (AlN) and coupled to a second mating plate in AlN by epoxy adhesive bonding, together with a sealable port for charging the working fluid (e.g., a capillary copper tube and Schrader valve) to form the enclosed fluid distribution network. AlN, for example, has high thermal conductivity (>200 W/m/K) and excellent electrical insulation properties. The above examples are meant to be illustrative only and not limiting in any manner. For example, other materials (e.g., silicon, copper and aluminum, etc.) can also be suitably used for fabricating the microfluidic distribution apparatus.

Prior to sealing the sealable port, the microfluidic distribution apparatus is charged with a proper working fluid and proper amount (e.g., depending on design/internal volume, the amount of charge can be less than 1 g in some cases). The selection of the working fluid may depend on various factors, such as operating conditions (e.g. horizontal or vertical orientation) and cooling requirements (e.g., maximum heat density dissipation). For example, the microfluidic distribution apparatus according to the various embodiments can use environmentally-friendly refrigerants (e.g., R1234ze, R1234yf, R1233zd), which are dielectric, non-toxic, and are in vapor phase at ambient conditions.

In accordance with another aspect and in the example of an optoelectronic device such as comb source 100 in which regulation of temperature is also a concern, additional considerations can be taken into account when using the microfluidic distribution apparatus according to the various embodiments. For example, temperature regulation in a comb source is important for wavelength stabilization. As such, an optical multiplexer implemented with an athermal technology (e.g., athermal AWG, athermal echelle grating, an arrangement of ring resonators or Mach-Zehnder interferometers using athermal waveguide technology, etc.) can fix the absolute wavelengths $\lambda_1, \lambda_2, \ldots \lambda_N$ of the comb source. Other methods and/or selection of components for maintaining constant temperature, if and when needed, would be a matter of design choice for other optoelectronic devices.

The thermal performance of the microfluidic distribution apparatus according to the embodiments can also be a design consideration, e.g., an optimized microfluidic distribution apparatus can result in lower thermal resistances and thus, lower chip temperature values. For example, if the structure of the evaporator section was changed from a parallel micro-channel implementation (referring to FIGS. 5A, 5B) to a more complex structure (e.g., an array of in-line or staggered micro-pin fins as shown in FIGS. 6A, 6B, 7A, 7B and 7C), the thermal resistance of the microfluidic distribution apparatus can be reduced because of higher heat transfer characteristics (for vertically-oriented configurations). The improved convective heat transfer coefficient in micro-pin fin structures is primarily associated with the larger effective heat transfer area and to the disruption/reattachment of boundary layers, as well as the generation of swirl and vortex secondary flows (e.g., turbulent flow at low Reynolds numbers). As such, the thermal resistance of the embedded microfluidic distribution apparatus can be reduced to match the operating temperature range where the RSOA gain is maximum, thus obtaining a higher optical output power from the comb source.

Although the present disclosure aims at using a solution which offers more advantages than one which involves the use of a TEC, this does not imply that the invention cannot be used in a device which also includes a TEC as an additional cooling feature. Indeed, it would be possible to make optoelectronic devices that include the cooling mechanism as proposed herein together with an additional cooling mechanism which includes a TEC. Such solutions, involving two different cooling mechanisms may be of interest in cases where a higher level of cooling and of temperature control are required as compared to a situation where only one cooling mechanism is used.

The foregoing merely illustrates the principles of the disclosure. It will thus be appreciated that those skilled in the art will be able to devise various arrangements that, although not explicitly described or shown herein, embody the principles of the disclosure and are included within its spirit and scope. Furthermore, all examples and conditional language recited herein are principally intended to be only for pedagogical purposes to aid the reader in understanding the principles of the disclosure and the concepts contributed by the inventor to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents. Additionally, it is intended that such equivalents include both currently known equivalents as well as equivalents developed in the future.

What is claimed is:

1. An apparatus for cooling an optoelectronic device, comprising:
   a microfluidic distribution apparatus positioned in an embedded arrangement with the optoelectronic device, the microfluidic distribution apparatus comprises:
   a plurality of micro-structures forming a closed loop fluid distribution circuit;
   an evaporator section having one or more of the micro-structures defined therein;
   a condenser section having one or more of the micro-structures defined therein; and
   an adiabatic section having one or more feeder micro-structures and one or more return micro-structures defined therein, the adiabatic section being in fluid communication with the evaporator section and the condenser section;
   wherein the closed loop fluid distribution circuit comprises the one or more micro-structures in the evaporator section, the one or more feeder micro-structures and the one or more return micro-structures in the adiabatic section, and the one or more micro-structures in the condenser section; and
   an evaporator inlet header section positioned between and in fluid communication with the one or more return micro-structures in the adiabatic section and the one or more micro-structures in the evaporator section, the evaporator inlet header section including a plurality of flow-directing structures;
   wherein the microfluidic distribution apparatus is configured to distribute a working fluid capable of phase change to passively remove heat from the optoelectronic device by:
   distributing the working fluid in the liquid state through the one or more microstructures in the evaporator section, wherein the working fluid converts to a two-phase liquid-vapor state via an evaporation process to remove heat generated by the optoelectronic device;
   further distributing the working fluid in the two-phase liquid-vapor state through the one or more feeder micro-structures in the adiabatic section to the one or more microstructures in the condenser section where heat is passively dissipated to air in natural convection via a condensation process, wherein the working fluid converts from the two-phase liquid-vapor state back to the liquid state;
   recirculating the working fluid converted back to the liquid state via the one or more return micro-structures in the adiabatic section back to the evaporator section; and
   the plurality flow-directing structurers configured to facilitate a substantially uniform flow of the working fluid in the liquid state from the one or more return micro-structures in the adiabatic section into the one or more micro-structures of the evaporator section and to control backflow of the working fluid from the evaporator section to the one or more return micro-structures in the adiabatic section.

2. The apparatus according to claim 1, wherein the microfluidic distribution apparatus further comprises:
   a condenser distributor section positioned between and in fluid communication with the one or more feeder micro-structures in the adiabatic section and the one or more micro-structures in the condenser section, the condenser distributor section comprising:
   a plurality of flow-directing structures having variable spacing therebetween such that a respective spacing between adjacent flow-directing structures from the plurality of flow-directing structures increases in the direction of the working fluid flowing from the one or more return micro-structures to facilitate a substantially uniform flow of the working fluid in the two-phase liquid-vapor state from the one or more feeder micro-structures into the one or more micro-structures of the condenser section.

3. The apparatus according to claim 1, wherein the plurality of flow-directing structures comprises:
   variable cross-sectional areas such that cross-sectional area of the plurality of flow-directing structures decreases in the direction of the working fluid flowing from the one or more return micro-structures.

4. The apparatus according to claim 1, wherein the plurality of flow-directing structures comprises:
   a plurality of apertures in fluid communication with the one or more micro-structures in the evaporator section, wherein respective diameters of the plurality of apertures increase in size in the direction of the working fluid flowing from the one or more return micro-structures in the adiabatic section.

5. The apparatus according to claim 1, wherein the microfluidic distribution apparatus and optoelectronic device are arranged in a vertical orientation, the evaporator section being positioned below the condenser section such that:
   distribution of the working fluid in the two-phase liquid-vapor state from the evaporator section toward the condenser section is facilitated by a buoyancy force; and distribution of the working fluid in the liquid state returned from the condenser section toward the evaporator section is facilitated by a gravity force.

6. The apparatus according to claim 5, wherein the one or more micro-structures in the evaporator section comprise artificial nucleation sites to facilitate distribution of the working fluid in the two-phase liquid-vapor state from the evaporator section toward the condenser section.

7. The apparatus according to claim 6, wherein the artificial nucleation sites comprise any of:
at least one perturbation in one or more surfaces of the one or more micro-structures in the evaporator section; and
at least one micro-structure positioned within the one or more micro-structures in the evaporator section.

8. The apparatus according to claim 6, wherein the artificial nucleation sites facilitate distribution of the working fluid in the two-phase liquid-vapor state from the evaporator section toward the condenser section by two-phase flow instabilities.

9. The apparatus according to claim 1, wherein the microfluidic distribution apparatus is positioned in the embedded arrangement with the optoelectronic device such that one or more heat-generating components on the optoelectronic device are substantially aligned with the evaporator section to facilitate heat transfer from the one or more heat-generating components into the evaporator section.

10. The apparatus according to claim 9, wherein the one or more heat-generating components are mounted on a substrate of the optoelectronic device, wherein the substrate includes a first buffer region and a second buffer region, the first buffer region being positioned proximate to a flow input side of the evaporator section for controlling backflow of the working fluid from the evaporator section, the second buffer region being positioned for controlling pre-boiling of the working fluid along surfaces joining the evaporator section and the one or more return micro-structures of the adiabatic section.

11. The apparatus according to claim 1, wherein the optoelectronic device is a comb laser source assembly comprising a plurality of reflective semiconductor optical amplifiers (RSOAs), and wherein the microfluidic distribution apparatus is positioned in the embedded arrangement with the optoelectronic device such that the RSOAs are substantially aligned with the evaporator section to facilitate heat transfer from the RSOAs into the evaporator section.

12. The apparatus according to claim 11, wherein the optoelectronic device further comprises an optical multiplexer/demultiplexer with an athermal structure operable for regulating temperature of the optoelectronic device for wavelength stabilization, the optical multiplexer/demultiplexer selected from the group of an athermal arrayed waveguide grating (AWG), an athermal echelle grating, a plurality of athermal ring resonators, and a plurality of athermal Mach-Zehnder interferometers.

13. The apparatus according to claim 1, wherein the evaporator section, the adiabatic section, and the condenser section are disposed between a first plate and a second plate to form the closed loop fluid distribution circuit.

14. The apparatus according to claim 13, wherein the embedded arrangement comprises the first plate or the second plate being in thermal and mechanical contact with a surface of the optoelectronic device.

15. The apparatus according to claim 13, wherein the first plate and the second plate are structures including material selected from the group of aluminum nitride (AlN), silicon, aluminum, and copper.

16. The apparatus according to claim 13, wherein the microfluidic distribution apparatus further comprises a sealable port for charging the working fluid.

17. A system for cooling an optoelectronic device, comprising:
a microfluidic distribution apparatus positioned in an embedded arrangement with the optoelectronic device, the microfluidic distribution apparatus a first cooling loop and a second cooling loop, each of the first and second cooling loops comprising:
an evaporator section having a first plurality of micro-structures defined therein;
an adiabatic section having a plurality of feeder micro-structures and a plurality of return micro-structures defined therein; and
a condenser section having a second plurality of micro-structures defined therein,
the first plurality of micro-structures, the second plurality of micro-structures, the plurality of feeder micro-structures and the plurality of return micro-structures together forming a closed loop fluid distribution circuit;
an evaporator inlet header section positioned between and in fluid communication with the one or more return micro-structures in the adiabatic section and the one or more micro-structures in the evaporator section, the evaporator inlet header section including a plurality of flow-directing structures;
the microfluidic distribution apparatus configured to distribute a working fluid capable of phase change to passively remove heat from the optoelectronic device by:
distributing the working fluid in a liquid state through the first plurality of micro-structures in the evaporator section, wherein the working fluid converts to a two-phase liquid-vapor state and removes heat generated by the optoelectronic device via an evaporation process; and
distributing the working fluid in the two-phase liquid-vapor state through the plurality of feeder micro-structures in the adiabatic section to the second plurality of micro-structures in the condenser section where heat is passively dissipated to air in natural convection via a condensation process, wherein the working fluid converts from the two-phase liquid-vapor state back to the liquid state for recirculation via the plurality of return micro-structures in the adiabatic section back to the evaporator section;
the plurality of flow directing structures configured to facilitate a substantially uniform flow of the working fluid in the liquid state from the one or more return micro-structures in the adiabatic section into the one or more micro-structures of the evaporator section and to control backflow of the working fluid from the evaporator section to the one or more return micro-structures in the adiabatic section, and
wherein the first cooling loop and the second cooling loop are adjacently joined in a side-by-side configuration separated by a wall structure, such that the evaporator section and the plurality of feeder micro-structures of the adiabatic section in the first cooling loop are adjacent to the evaporator section and the plurality of feeder micro-structures of the adiabatic section in the second cooling loop.

18. The system according to claim 17, wherein the first cooling loop and the second cooling loop are configured such that a direction of flow of the working fluid in the first cooling loop is counter to a direction of flow of the working fluid in the second cooling loop.

\* \* \* \* \*